United States Patent
Ehlen

(10) Patent No.: US 10,362,708 B2
(45) Date of Patent: Jul. 23, 2019

(54) FAN CARTRIDGE

(71) Applicant: Facebook, Inc., Menlo Park, CA (US)

(72) Inventor: Jon Brian Ehlen, Newark, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 15/697,287

(22) Filed: Sep. 6, 2017

(65) Prior Publication Data
US 2019/0075677 A1    Mar. 7, 2019

(51) Int. Cl.
*H05K 7/14* (2006.01)
*H05K 7/20* (2006.01)
*G06F 1/20* (2006.01)

(52) U.S. Cl.
CPC ............. *H05K 7/1492* (2013.01); *G06F 1/20* (2013.01); *H05K 7/1489* (2013.01)

(58) Field of Classification Search
CPC ............ G06F 1/20; G06F 1/183; G06F 1/181; H05K 7/20172; H05K 7/20581; H05K 7/20727; H05K 7/1487; H05K 7/20; H05K 7/20736; H05K 7/1492; H05K 7/1489
See application file for complete search history.

(56) References Cited

U.S. PATENT DOCUMENTS

| | | | |
|---|---|---|---|
| 6,244,953 B1* | 6/2001 | Dugan | H05K 7/20172 361/695 |
| 6,674,641 B2* | 1/2004 | Jensen | G06F 1/18 165/80.3 |
| 6,865,078 B1* | 3/2005 | Chang | H05K 7/20727 361/690 |
| 7,021,895 B2* | 4/2006 | Rubenstein | F04D 25/166 415/207 |
| 7,839,638 B2* | 11/2010 | Ye | G06F 1/20 361/694 |
| 8,727,750 B2* | 5/2014 | Lu | F04D 29/601 417/423.14 |
| 2003/0099094 A1* | 5/2003 | Coles | H05K 7/1409 361/726 |
| 2005/0254210 A1* | 11/2005 | Grady | H05K 7/20581 361/695 |
| 2006/0285292 A1* | 12/2006 | Fan | H05K 7/20172 361/695 |
| 2007/0153477 A1* | 7/2007 | Liang | G06F 1/20 361/695 |
| 2013/0058781 A1* | 3/2013 | Fu | H05K 7/20581 415/220 |
| 2013/0100613 A1* | 4/2013 | Nakai | H05K 7/20563 361/695 |

(Continued)

*Primary Examiner* — James Wu
*Assistant Examiner* — Michael A Matey
(74) *Attorney, Agent, or Firm* — FisherBroyles, LLP

(57) ABSTRACT

Technology is provided for a device sled with a fan cartridge. The device sled includes a sled chassis having a bottom wall and first and second opposed sidewalls. A pair of spaced apart channels are each coupled to the bottom wall and include an associated latch aperture. A fan cartridge is removably inserted between the pair of spaced apart channels. The fan cartridge includes a cartridge frame and one or more fans coupled to the cartridge frame. One or more latches are positioned on the cartridge frame to engage a corresponding latch aperture when the fan cartridge is inserted between the pair of spaced apart channels.

14 Claims, 21 Drawing Sheets

(56) References Cited

U.S. PATENT DOCUMENTS

| | | | |
|---|---|---|---|
| 2013/0329371 A1* | 12/2013 | Lee | G06F 1/183 |
| | | | 361/724 |
| 2015/0245538 A1* | 8/2015 | Yu | H05K 7/20172 |
| | | | 454/184 |
| 2017/0023990 A1* | 1/2017 | Huang | G06F 1/185 |
| 2017/0027073 A1* | 1/2017 | Zani | G06F 1/185 |
| 2017/0086332 A1* | 3/2017 | Jaskela | H05K 7/20718 |

* cited by examiner

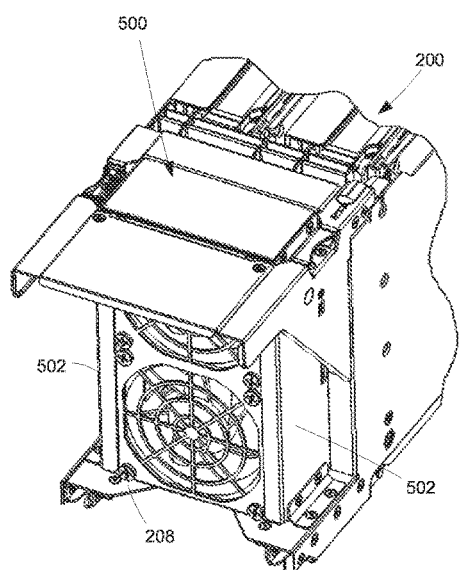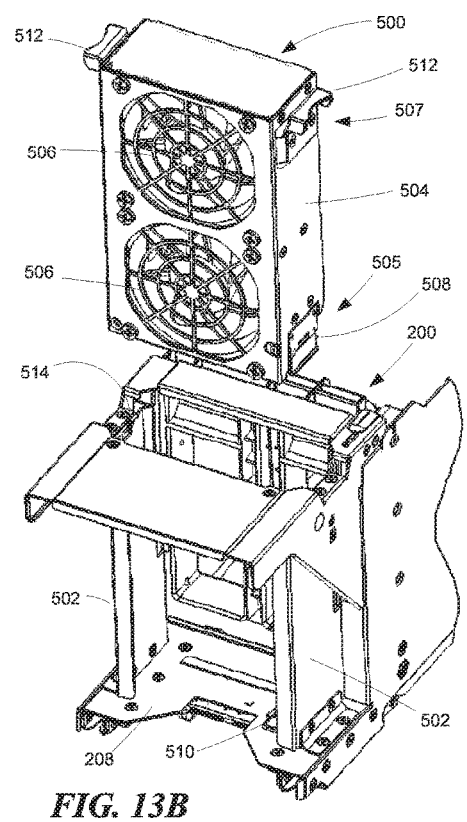
*FIG. 13A*  *FIG. 13B*

US 10,362,708 B2

FAN CARTRIDGE

TECHNICAL FIELD

This patent application generally relates to data storage server configurations, and more specifically, to server device platform configurations.

BACKGROUND

Capital and operating expenses for data centers have become an increasing part of IT organizations' budgets over time. Data centers are complex facilities including many rows of data storage server racks. Each server rack has a footprint which consumes real estate, power, and cooling resources. With all the power, cooling, and cabling infrastructure, data centers are expensive facilities to operate. Thus, each server rack's footprint should be used efficiently in order to reduce costs and maximize profit. The more storage devices housed within a server rack, the more efficient the use of the footprint. However, server racks must also be designed to provide adequate cooling, prevent interference (e.g., EMI/RFI) among devices, and facilitate safe and efficient deployment and maintenance of the systems.

While existing rack designs are functional, there is still room for improvements in many aspects of server rack design. For example, many servers and other computer systems contain components mounted on sliding trays or device sleds, which allow technicians to easily access and replace the components without having to open the chassis of the computer system. In some cases, a pair of elongate conductors are provided to continuously power the device sleds as they are extended from the system chassis. Thus, measures for preventing inadvertent exposure to the conductors should be considered. Furthermore, in order to facilitate extending the device sleds from the chassis, communication cables, which are often connected at the front of each sled, must be at least as long as the desired travel length of the sled. This causes the cables to occupy a considerable amount of space when the sled is fully inside the chassis. This excess cable length (e.g., service loop) should be managed to prevent stress on associated connectors and to prevent interference with air-flow in the chassis.

BRIEF DESCRIPTION OF THE DRAWINGS

Embodiments of the cable management enclosure, device sled interference shield, fan cartridge, device sled extension limit latch, and latch handle with plunger lock disclosed herein may be better understood by referring to the following Detailed Description in conjunction with the accompanying drawings, in which like reference numerals indicate identical or functionally similar elements:

FIG. 13A is an isometric view of a fan cartridge, according to a representative embodiment, inserted in a sled chassis.

FIG. 13B is an isometric view of the fan cartridge removed from the sled chassis.

Figure 1:
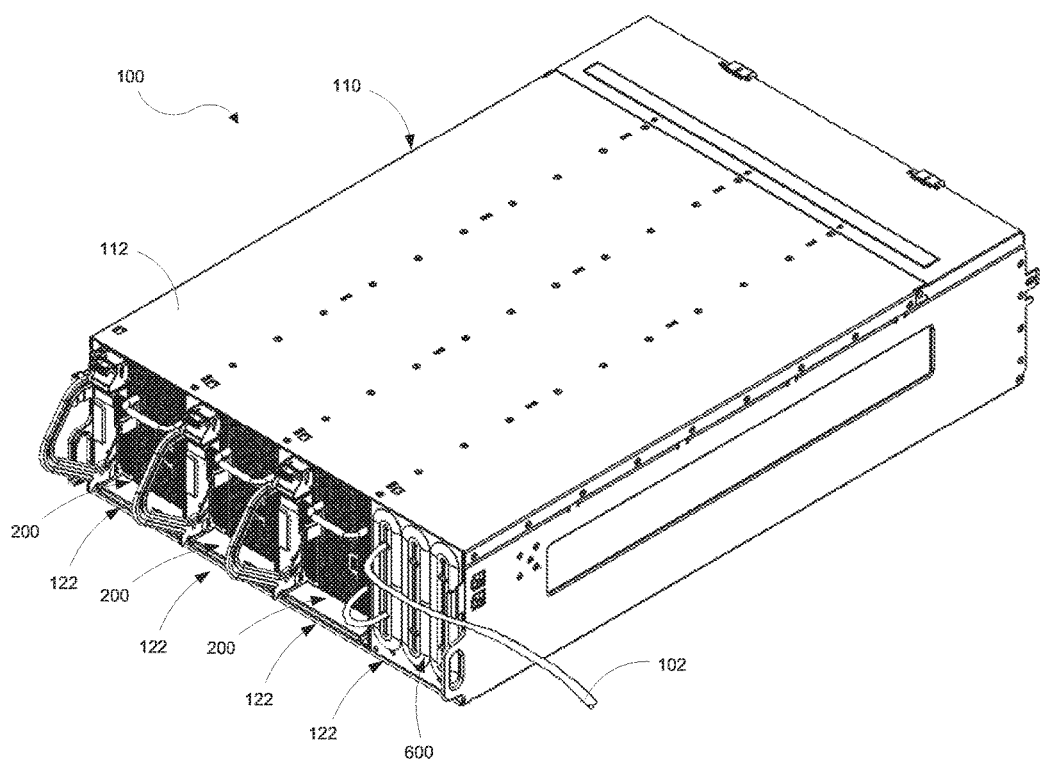
FIG. 1 is an isometric view of a device platform with a cubby chassis according to a representative embodiment.

The headings provided herein are for convenience only and do not necessarily affect the scope or meaning of the claimed embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to unnecessarily limit the embodiments described. On the contrary, the embodiments are intended to cover all suitable modifications, equivalents, and alternatives falling within the scope of the embodiments as defined by the appended claims.

DETAILED DESCRIPTION

Overview

A device platform with continuously powered device sleds is disclosed. In some embodiments, the device platform is a server platform and the device sleds are server sleds. In an embodiment, a server platform can include a cubby chassis including one or more partitions defining a plurality of sled positions. A server sled can be positioned in each sled position and continuously powered by a pair of elongate conductors even as they are extended from the cubby chassis. This arrangement can facilitate "hot swap" maintenance procedures.

Disclosed herein is a latch handle with a plunger lock to securely latch and lock the server sled in its corresponding sled position. In an embodiment, the server sled includes a sled chassis which has a bottom wall and a sidewall extending between a front sled portion and a rear sled portion and a latch handle. The latch handle includes a proximal end portion pivotably coupled to the sled chassis proximate the front sled portion. A latch pawl extends from the proximal end portion of the handle. The latch handle is pivotable between a latched position where the latch pawl is positioned to engage a latch feature of the cubby chassis, thereby preventing movement of the sled chassis with respect to the cubby chassis, and an unlatched position where the latch pawl is disengaged from the latch feature of the cubby chassis. A handle lock is disposed on a distal end portion of the latch handle to selectively lock the latch handle in the latched position.

In order to prevent the server sleds from being inadvertently removed from the cubby chassis, thereby exposing the conductors, the device sleds can each be provided with an extension limit latch as disclosed herein. In a representative embodiment, the extension limit latch can include a latch arm having a proximal end portion pivotably coupled to the sled chassis proximate the rear sled portion. A latch barb extends from a mid-portion of the latch arm, and a distal end portion of the arm includes an actuation tab. The latch arm is pivotable between a latched position where the latch barb is positioned to engage a latch feature of a cubby chassis, thereby preventing removal of the sled chassis from the cubby chassis, and an unlatched position where the latch barb is disengaged from the latch feature of the cubby chassis. In some embodiments, a latch cover can be positioned on the sled chassis to cover the actuation tab, thereby preventing a user from moving the latch arm to the unlatched position without using a tool.

In some embodiments, the server sleds can include a removable fan cartridge to facilitate efficient fan replacement. In a representative embodiment, a pair of spaced apart channels can each be coupled to the bottom wall of the device chassis. Each channel can include an associated latch aperture. The fan cartridge is removably inserted between the pair of spaced apart channels. In some embodiments, the fan cartridge can include a cartridge frame and one or more fans coupled to the cartridge frame. One or more latches are positioned on the cartridge frame to engage a corresponding latch aperture when the fan cartridge is inserted between the pair of spaced apart channels. Thus, the fan cartridge can be easily removed from the device chassis without tools. In some embodiments, the fan cartridge can include a cartridge connector that mates with a corresponding chassis connector when the fan cartridge is inserted between the pair of spaced apart channels.

In some embodiments, the server platform can include a cable management enclosure to manage communication cable service loops. In a representative embodiment, the cable management enclosure can include an elongate bottom panel having a first end portion and a second end portion. A front panel is coupled to the first end portion and has at least one elongate aperture positioned to receive the service loop of one of the communication cables. An elongate grommet is mounted in each of the elongate apertures to help retain the service loop in the enclosure. An end panel is coupled to the second end portion and a cover is coupled to at least one of the bottom panel, the front panel, and the end panel. The cover can include a top panel and a pair of side panels.

In some embodiments, each device sled chassis can include a removable interference shield to protect against electromagnetic interference (EMI) and radio frequency interference (RFI). In a representative embodiment, a shield support bracket is coupled to a first sidewall of the sled chassis and an interference shield is removably coupled to the shield support bracket and the device chassis' second sidewall. The interference shield can include a shield panel, first and second opposed side flanges extending from the shield panel, and a latch coupled to the first side flange and positioned to engage the shield support bracket. In some embodiments, a handle is coupled to the shield panel and positioned adjacent the latch such that the latch can be disengaged from the shield support bracket by a user's thumb or other portion of the user's hand when the handle is grasped. Accordingly, the shield can be easily removed without tools to maintain sled components behind the shield.

General Description

Various examples of the technologies introduced above will now be described in further detail. The following description provides specific details for a thorough understanding and enabling description of these examples. One skilled in the relevant art will understand, however, that the techniques discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description.

The terminology used below is to be interpreted in its broadest reasonable manner, even though it is being used in conjunction with a detailed description of some specific examples of the embodiments. Indeed, some terms may even be emphasized below; however, any terminology intended to be interpreted in any restricted manner will be overtly and specifically defined as such in this section.

Figure 2:
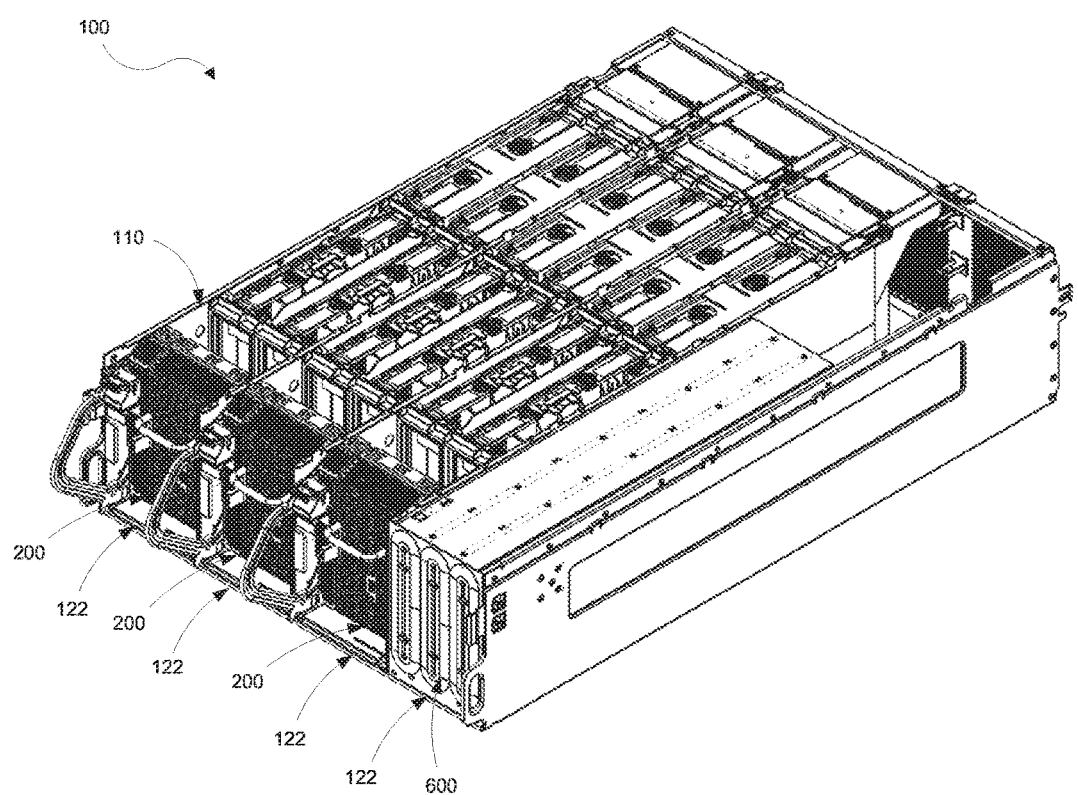
FIG. 2 is an isometric view of the device platform with the top removed from the cubby chassis.
Figure 3:
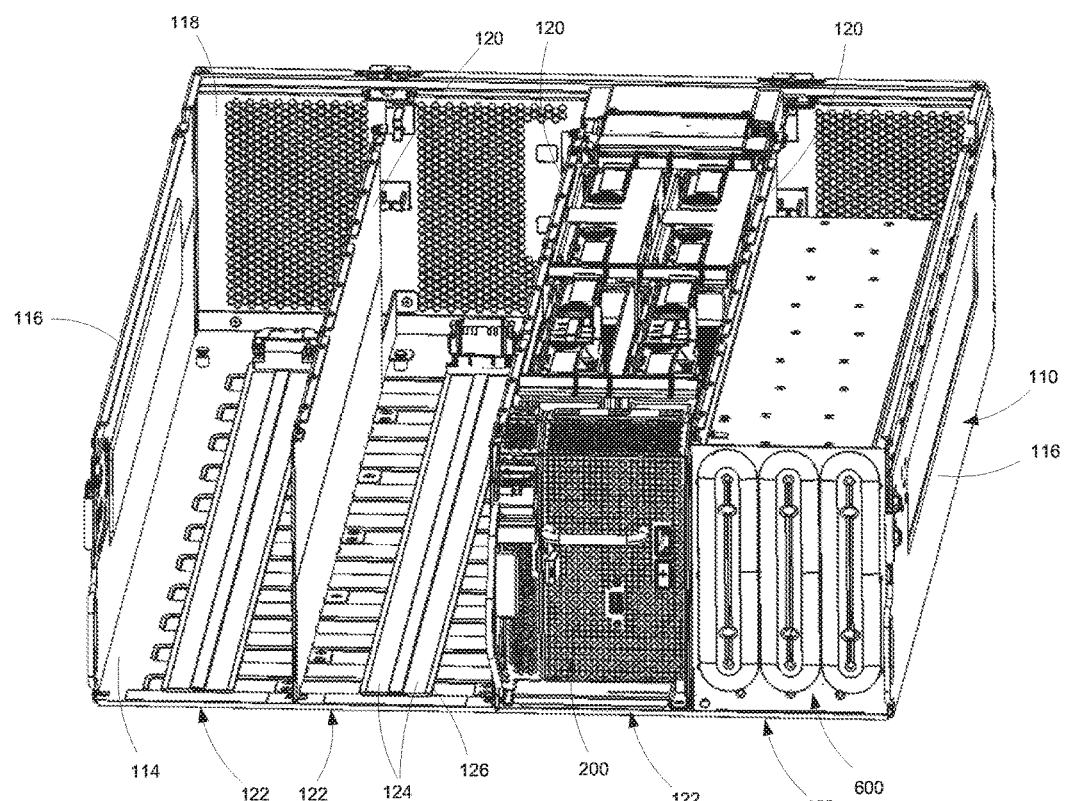
FIG. 3 is an isometric view of the device platform with two device sleds removed.

As shown in FIGS. 1 and 2, the device platform 100 includes a cubby chassis 110 configured to mount into a component rack (not shown) and house one or more device sleds 200 containing on or more devices (e.g., server and/or memory modules). The illustrated cubby chassis 110 can be a sheet metal chassis, and it can include four sled positions 122 sized and configured to receive a device sled 200 or a cable management enclosure 600 in each position. As explained more fully below, the cable management enclosure 600 is configured to house excess cable length, such as a communication cable 102, when a corresponding device sled 200 is in a stowed position, as shown in FIG. 1, for example. The cubby chassis 110 of other embodiments can have a greater or fewer number of sled positions 122. The cubby chassis 110 includes a top panel 112 (FIG. 1) and a bottom panel 114 as shown in FIG. 3. With continued reference to FIG. 3, the cubby chassis 110 includes spaced apart sidewalls 116 and an end wall 118. Three partitions 120 are positioned between the top and bottom panels (112, 114) to divide the cubby chassis 110 into the four sled positions 122.

Each of the four sled positions 122 can include a pair of elongate conductors 124 extending along the length of the sled positions 122 in order to continuously provide power to a corresponding device sled 200 as the sled is moved in and out of the cubby chassis 110 for maintenance. In some embodiments, the elongate conductors 124 are disposed on an elongate conductor support, such as a conductor printed circuit board (PCB) 126.

Figure 4:
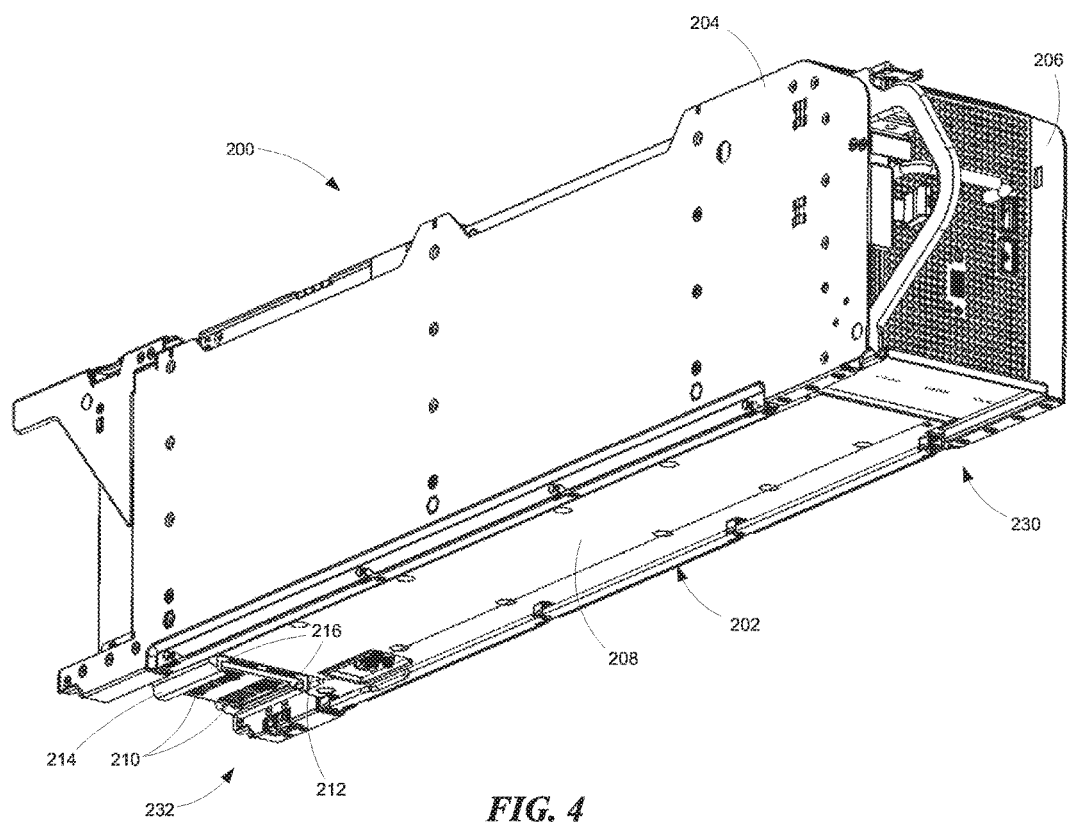
FIG. 4 is an isometric view of a device sled as viewed from below.

As shown in FIG. 4, the illustrated device sled 200 includes a sled chassis 202 having opposed first and second sidewalls 204 and 206 with a recessed bottom wall 208 extending therebetween. The bottom wall 208 and the sidewalls 204 and 206 extend between a front portion 230 and a rear portion 232. In some embodiments, conductive elements 210 are mounted on a bottom-plane PCB 212 for sliding contact with the pair of elongate conductors 124 (FIG. 3) on the bottom panel 114 of the cubby chassis 110. In some embodiments, the conductive elements 210 are spring biased toward the pair of elongate conductors 124. A conductor guide 214 can be mounted to the bottom-plane PCB 212 to surround the conductive elements 210. In some embodiments, the conductor guide 214 includes a pair of opposed grooves 216 adapted to slideably receive the conductor PCB 126 (FIG. 3). The sled chassis 202 slides along the bottom panel 114 between stowed (e.g., FIG. 3) and extended positions (e.g., FIG. 10) with constant contact between the conductor elements 210 and the elongate conductors 124 to provide continuous power as the device sled 200 moves between the stowed and extended positions. Additional examples of continuously powered device sleds are described in U.S. Pat. No. 9,693,477 and co-pending U.S. patent application Ser. No. 15/619,407, filed Jun. 9, 2017, the disclosures of which are incorporated herein by reference in their entireties.

Figure 5:
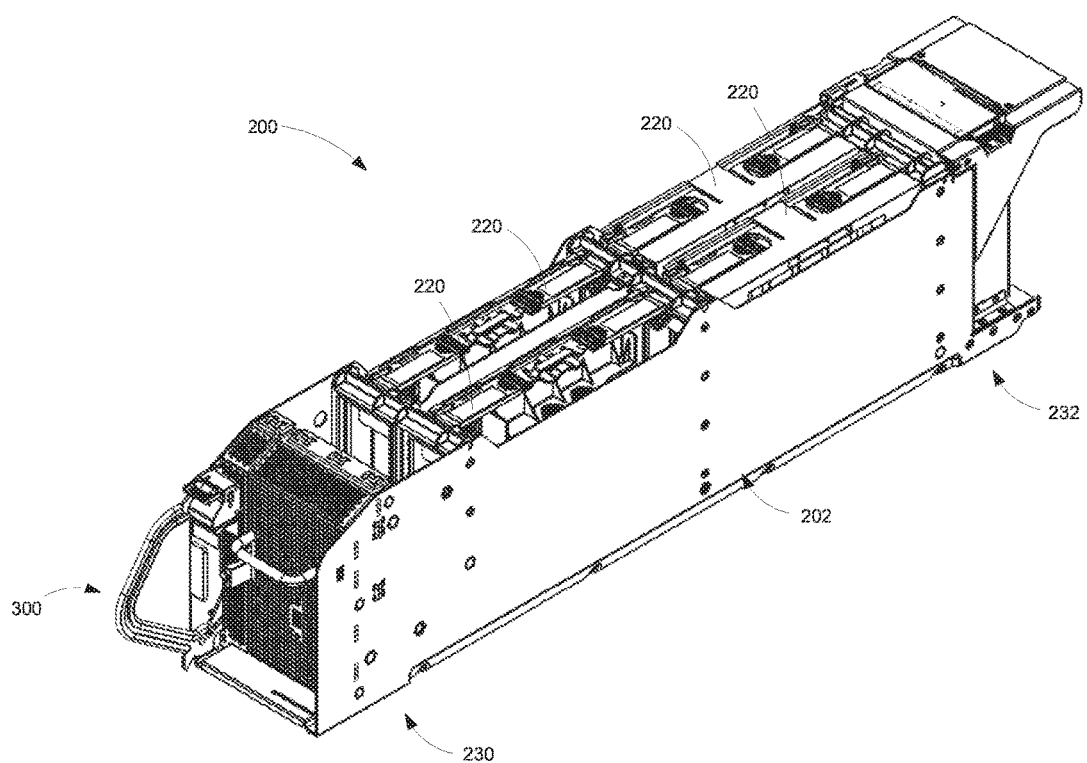
FIG. 5 is an isometric view of the device sled as viewed from above.

As shown in FIG. 5, the device sled chassis 202 can be configured to contain several devices, such as server modules 220. Although the embodiments are, in some instances, described herein with respect to servers, other computer devices, such as memory and graphics processing units, etc., can be used or contained in the device sleds 200. In some embodiments, the device sleds 200 can be latched in the stowed position with a latch handle mechanism 300.

Figure 6A:
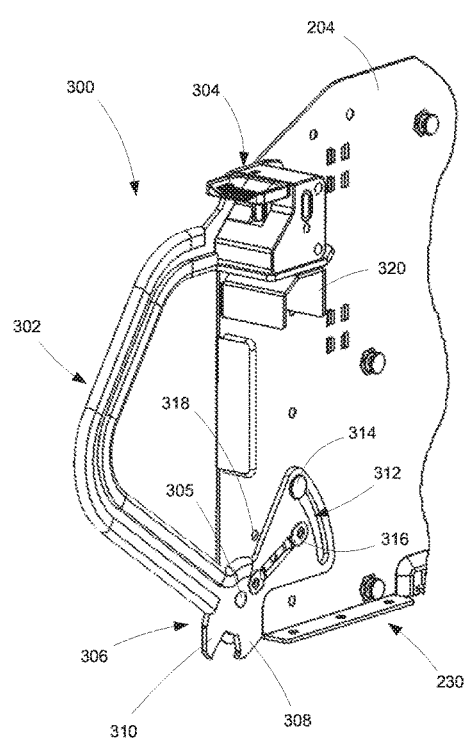
FIG. 6A is a partial isometric view of a latch handle with plunger lock according to a representative embodiment.
Figure 6B:
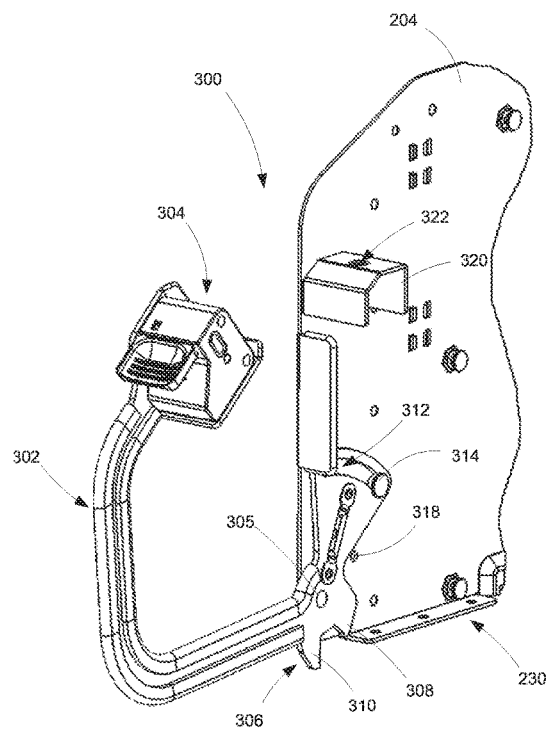
FIG. 6B is a partial isometric view of the latch handle with plunger lock in an unlatched position.

As shown in FIGS. 6A and 6B, the latch handle mechanism 300 can include a latch handle 302 and a handle lock 304 to selectively lock the latch handle in the latched position (e.g., FIG. 6A). A strike bracket 320 is mounted to the sidewall 204 and positioned such that the handle lock 304 releasably engages a bracket aperture 322 formed in the strike bracket 320 when the latch handle 302 is in the latched position.

The latch handle 302 includes a proximal end portion 306 movably coupled to the sidewall 204 proximate the front sled portion 230. In some embodiments, the proximal end portion 306 is coupled to the sidewall 204 with a pivot pin 305, for example. The latch handle 302 is pivotable or otherwise movable between the latched position (FIG. 6A) and an unlatched position (FIG. 6B). In some embodiments, the proximal end portion 306 can include a limit slot 312 positioned on a stop pin 314 secured to the sidewall 204, whereby rotational movement of the latch handle 302 toward the latched and unlatched positions is limited. In some embodiments, the proximal end portion 306 can include a detent configuration, such as a detent spring 316 positioned for engaging detent holes 318, to help hold the latch handle 302 in different rotational positions.

A latch pawl 308 and an opposing ejector pawl 310 extend from the proximal end portion 306. When the latch handle 302 is in the latched position, the latch pawl 308 is positioned to releasably engage a latch feature, such as a latch aperture 130, shown in FIG. 7. In some embodiments, the latch aperture 130 is formed in the bottom panel 114 of the cubby chassis 110. The latch pawl 308 prevents movement of the device sled 200 with respect to the cubby chassis 110 when the latch handle 302 is in the latched position. The ejector pawl 310 works against a front edge 115 of the bottom panel 114 as the latch handle 302 is moved toward the unlatched position, thereby levering the device sled 200 from its sled position 122 as the latch pawl 308 disengages the latch aperture 130. Once the latch pawl 308 is disengaged from the latch aperture 130, the device sled 200 can be moved toward the extended position for maintenance.

Figure 8:
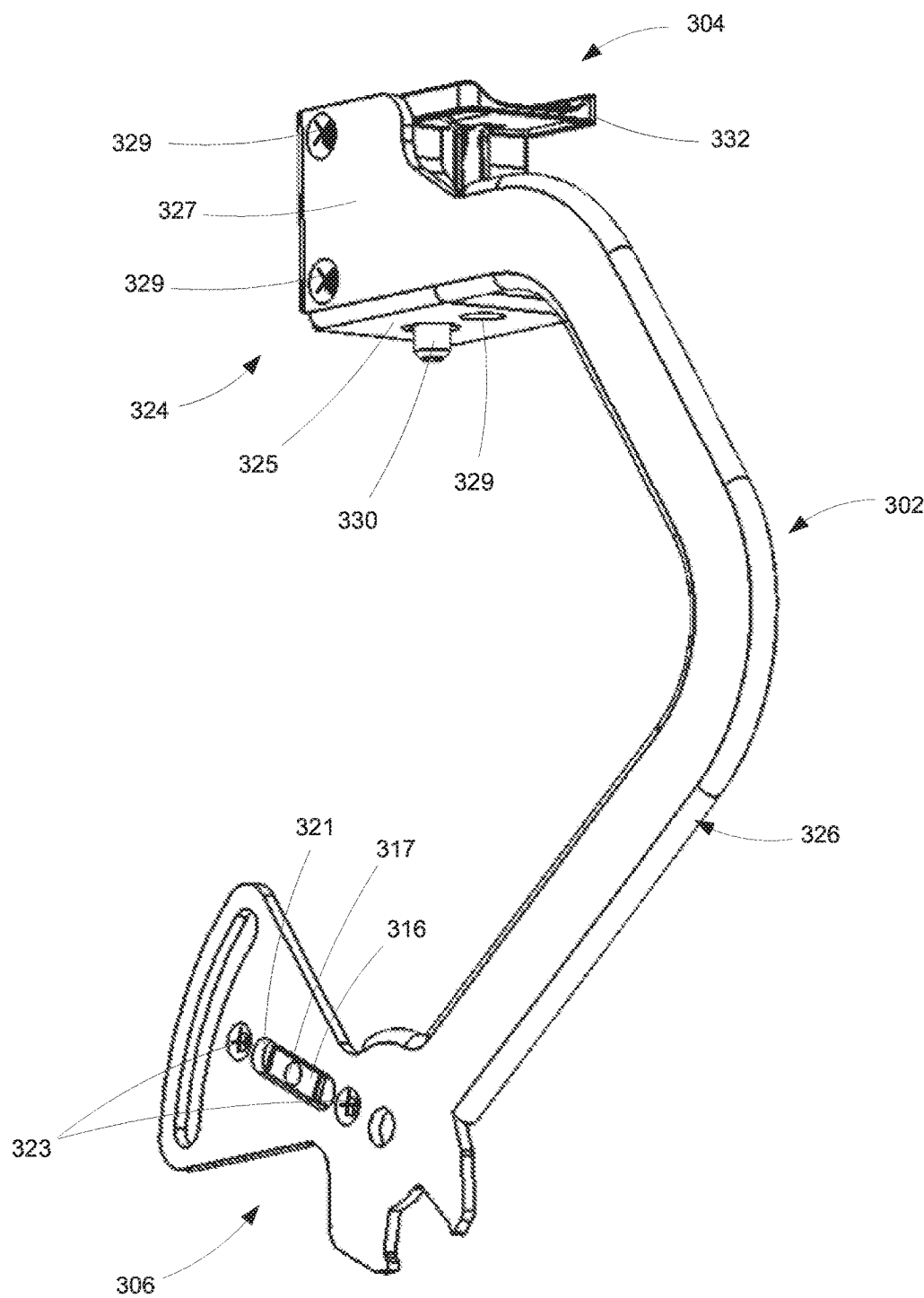
FIG. 8 is an isometric view of the latch handle with plunger lock as viewed from the left.

As shown in FIG. 8, the latch handle 302 extends from the proximal end portion 306 to a distal end portion 324. In some embodiments, the latch handle 302 includes an arcuate portion 326. As best shown in FIG. 8, the detent spring 316 can comprise a leaf spring with a centrally positioned protrusion 317 adapted to engage the detent holes 318 (FIGS. 6A and 6B). In some embodiments, the detent spring 316 can be mounted in a slot 321 with fasteners 323.

The handle lock 304 is disposed on the distal end portion 324 and includes a lock plunger 330 and a button 332 operative to move the plunger 330 toward a retracted (i.e., unlocked) position when the button is depressed by a user. When the latch handle 302 is in the latched position, the plunger 330 engages the bracket aperture 322 (FIG. 6B), thereby locking the latch handle 302 in the latched position. The distal end portion 324 can include orthogonally oriented mounting flanges 325 and 327. The handle lock 304 is attached to the mounting flanges 325 and 327 with fasteners 329.

Figure 9A:
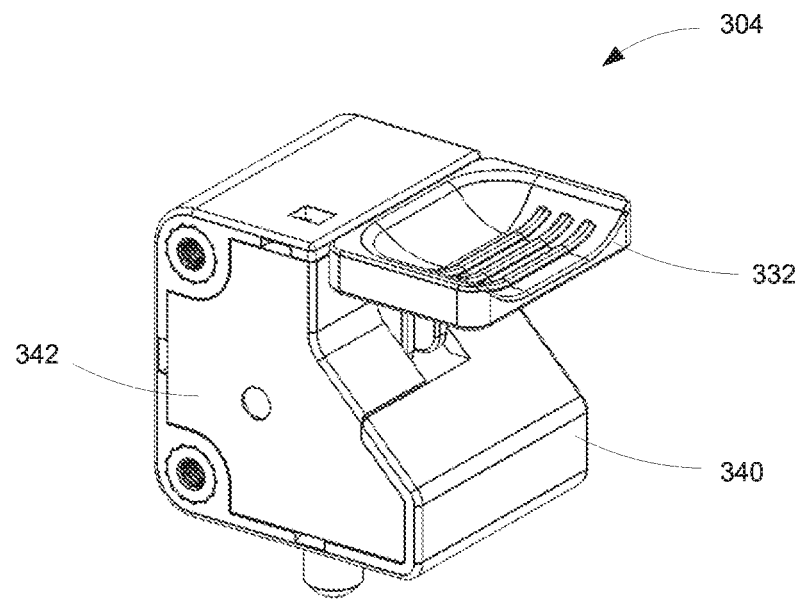
FIG. 9A is an isometric view of the plunger lock according to a representative embodiment.
Figure 9B:
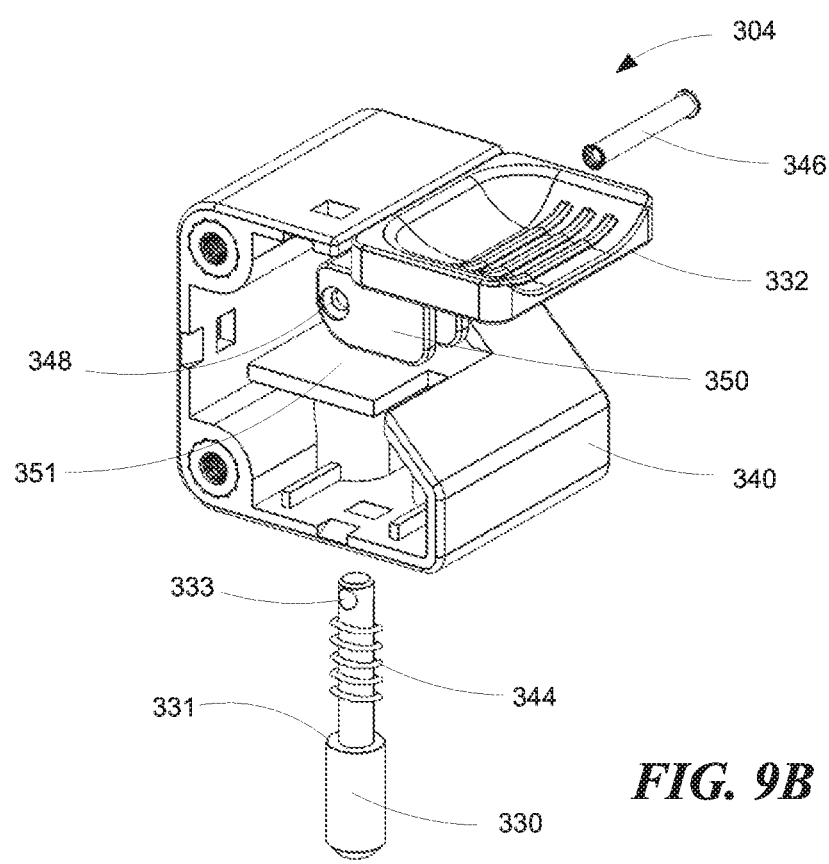
FIG. 9B is an exploded isometric view of the plunger lock.

As shown in FIGS. 9A and 9B, the handle lock 304 includes a housing 340 and a mating side cover 342. In some embodiments, a resilient member, such as a compression spring 344, is positioned between the housing 340 and the lock plunger 330 to urge the plunger 330 toward an extended (i.e., locked) position. In some embodiments, the plunger includes a shoulder 331 to capture the spring 344 in a pocket (not shown) formed in the housing 340. The button 332 includes a cam portion 350 configured to act against a surface 351 to cause an associated cam aperture 348 to move away from the surface 351 when the button 332 is depressed by a user. A plunger pin 346 extends through both the cam aperture 348 and a plunger cross-hole 333, thereby coupling the plunger 330 to the cam portion 350. Accordingly, as the button 332 is depressed the plunger 330 is moved toward the retracted (i.e., unlocked) position.

Figure 10:
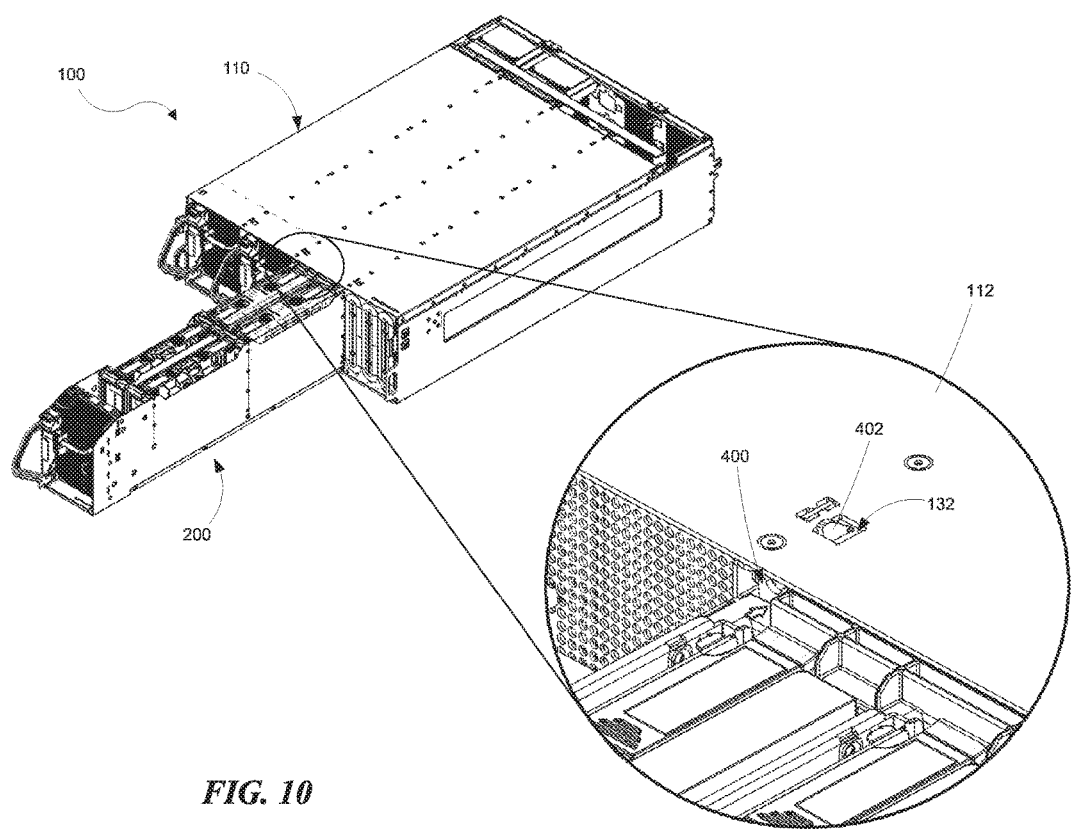
FIG. 10 is an enlarged partial view of a device sled extension limit latch according to a representative embodiment.

As shown in FIG. 10, each device sled 200 can include an extension limit latch 400 operative to engage a latching feature on the cubby chassis 110 when the device sled 200 is moved to the extended position in order to prevent the device sled 200 from being inadvertently removed from the cubby chassis 110. Removing a device sled 200 from the cubby chassis 110 disconnects the device sled 200 from the corresponding elongate conductors 124 (FIG. 3) and leaves the conductors exposed where they could be inadvertently contacted and damaged. In some embodiments, the latching feature can comprise a barb aperture 132 formed in the top panel 112 of the cubby chassis 110 which is releasably engaged by a latch member, such as latch barb 402. The latch barb 402 can have any suitable size or shape configured to extend at least partially into the barb aperture for engagement with the top panel and/or to block the device sled 200 from moving relative to the cubby chassis when the latching feature is in the latched position.

Figure 11A:
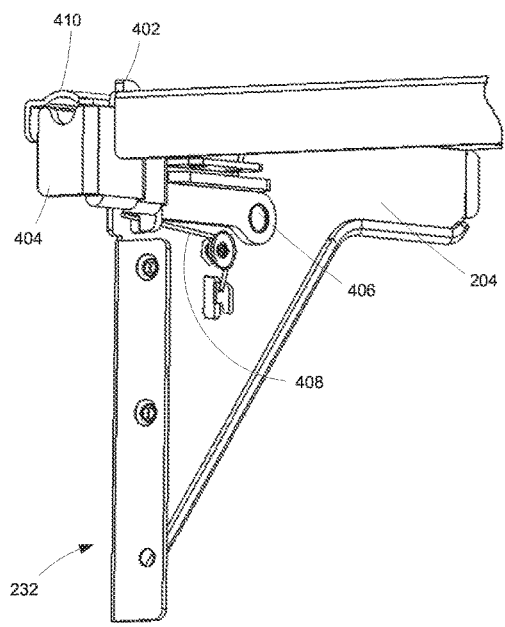
FIG. 11A is a partial isometric view of the limit latch in a latched position.
Figure 11B:
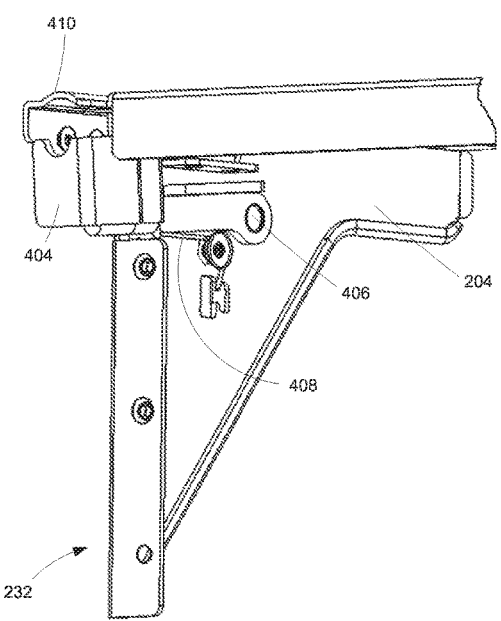
FIG. 11B is a partial isometric view of the limit latch in an unlatched position.

As shown in FIGS. 11A and 11B, the extension limit latch 400 can include a latch arm 404 coupled to the sidewall 204 proximate the rear sled portion 232 with a pivot pin 406. The latch arm 404 is pivotable between a latched position (FIG. 11A) and an unlatched position (FIG. 11B). In the latched position, the latch barb 402 is positioned to engage the barb aperture 132 (FIG. 10), thereby preventing removal of the device sled 200 from the cubby chassis 110, and in the unlatched position the latch barb 202 is disengaged from the barb aperture 132, thereby allowing the device sled 200 to be removed from the cubby chassis 110 (FIG. 10). A resilient member, such as a torsion spring 408, is positioned between the latch arm 404 and the sidewall 204 to urge the latch arm 404 toward the latched position. In some embodiments, a cover 410 is positioned over the latch arm 404, thereby preventing a user from moving the latch arm to the unlatched position without the use of a tool, such as a stylus or screw driver, for example.

Figure 12:
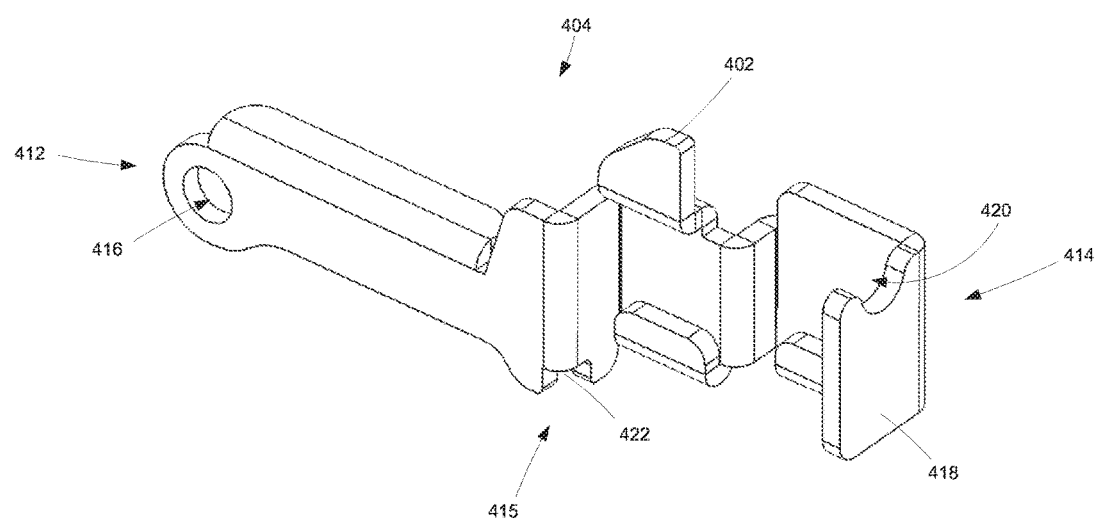
FIG. 12 is an isometric view of the latch arm.

As shown in FIG. 12, the latch arm 404 includes a proximal end portion 412 having a pivot aperture 416 for pivotably coupling the latch arm 404 to the sled chassis. The latch barb 402 extends from a mid-portion 415 of the latch arm 404. The distal end portion 414 of the latch arm 404 includes an actuation tab 418 having a notch 420. The notch 420 provides an opening between the actuation tab 418 and the cover 410 (FIG. 11A/11B). The notch 420 is sized to provide an opening just large enough to receive a tool, but not a user's finger. The mid-portion of the latch arm 404 can also include a spring notch 422 to hold an end of the torsion spring 408 (FIG. 11A/11B) in position.

As shown in FIGS. 13A and 13B, each device sled 200 can include a fan cartridge 500 removably inserted between a pair of channels 502. Each channel 502 is coupled to a bottom wall 208 of the device sled chassis 202 (FIG. 4) in spaced apart relation to each other. The fan cartridge 500 can include a cartridge frame 504 and two fans 506 coupled to the cartridge frame 504. In some embodiments, the fan cartridge 500 includes a cartridge connector 508 positioned proximate a first end portion 505 of the cartridge frame 504 to mate with a corresponding chassis connector 510 when the fan cartridge 500 is inserted between the channels 502. In some embodiments, the cartridge frame 504 includes a pair of latches 512 positioned proximate a second end portion 507 of the cartridge frame 504 to engage a corresponding latch aperture 514 when the fan cartridge 500 is inserted between the pair of spaced apart channels 502.

Figure 14:
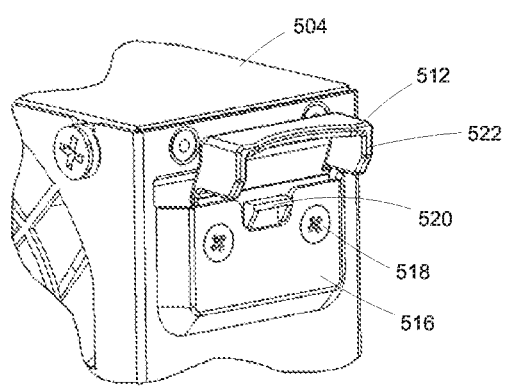
FIG. 14 is an enlarged partial isometric view of a fan cartridge latch.

As shown in FIG. 14, each of the latches 512 can be positioned in a corresponding latch pocket 516 and retained therein with fasteners 518. Each latch 512 can include a latch barb 520 connected to a latch tab 522 such that depressing the latch tab 522 moves the latch barb 520 away from and out of the associated latch aperture 514 allowing the fan cartridge 500 to be removed from the channels 502.

Figure 15:
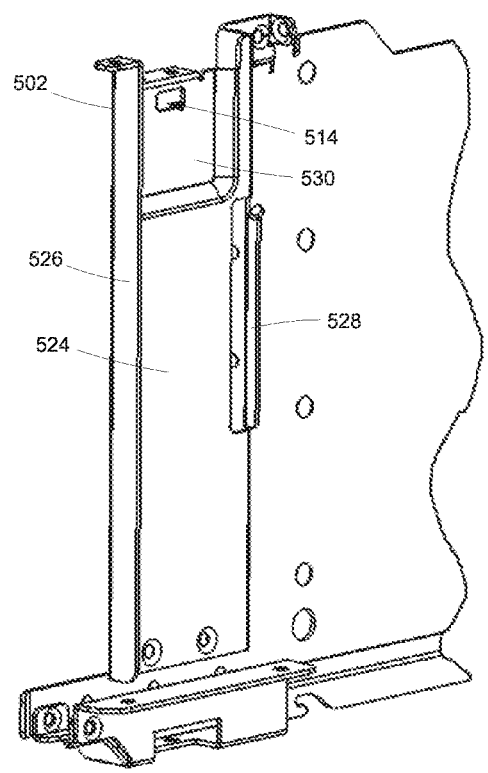
FIG. 15 is a partial isometric view of a fan cartridge channel.

As shown in FIG. 15, each channel 502 can include a central panel 524 having opposed longitudinal sides and a pair of rails 526 and 528 each extending at least partially along a corresponding one of the longitudinal sides of the central panel 524. In some embodiments, the central panel 524 can include a recessed region 530 positioned to receive a corresponding latch pocket 516 when the fan cartridge 500 is installed between the channels 502. In some embodiments, the fan cartridge 500 and the pair of spaced apart channels 502 can comprise a fan assembly mountable to a device sled chassis.

Figure 16:
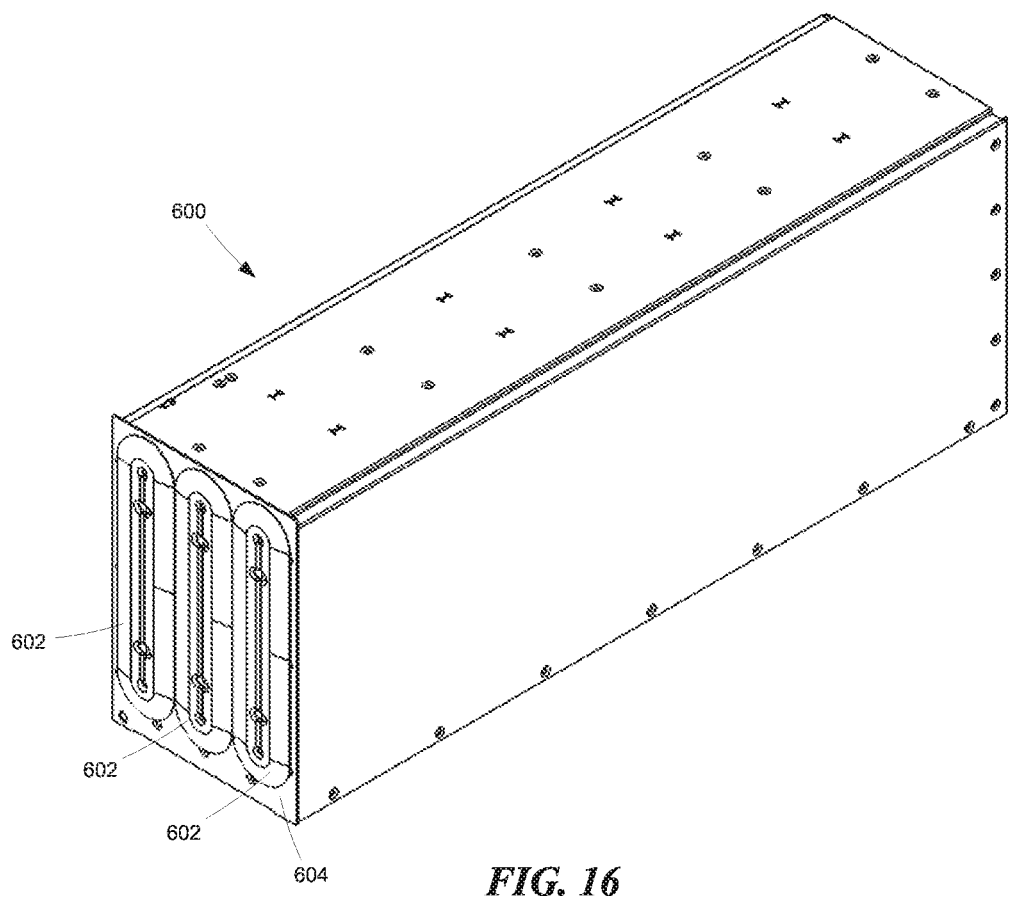
FIG. 16 is an isometric view of a cable management enclosure according to a representative embodiment.

As shown in FIG. 16, the cable management enclosure 600 is an elongate enclosure configured to contain the service loop of one or more cables, such as the communication cable 102 (FIG. 1), when a corresponding device sled 200 is in the stowed position. When the device sled 200 is moved out of the cubby chassis 110, the cable 102 can be withdrawn from the enclosure 600 to provide enough length to move the device sled 200 to the extended position (FIG. 10). The enclosure 600 can include grommets 602 mounted in a front panel 604 to help retain the cables within the enclosure when the device sled 200 is stowed. In some embodiments, the cable management enclosure 600 can have the same general dimensions as the device sleds 200 in order to fit into one of the sled positions 122 (FIG. 1).

Figure 17:
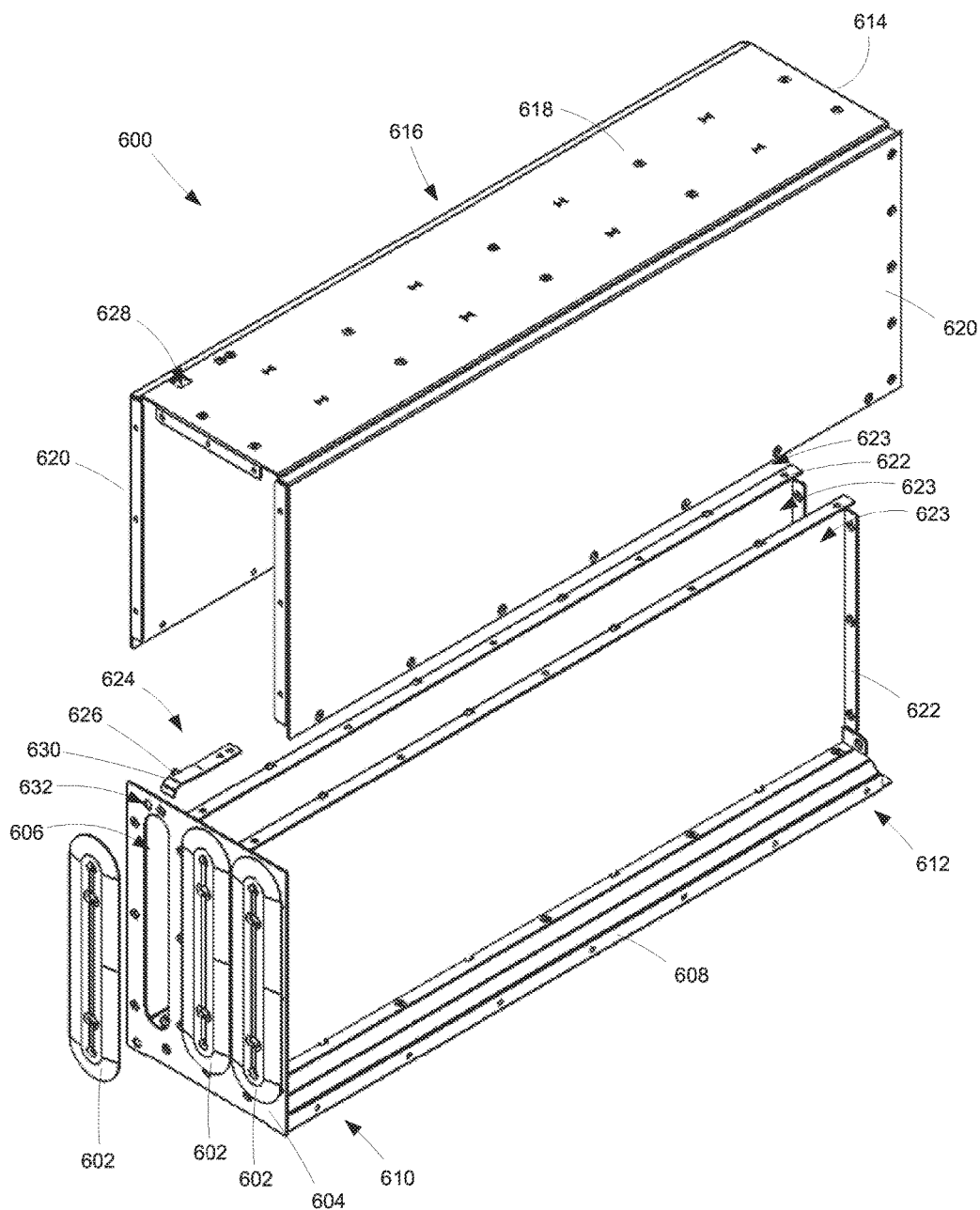
FIG. 17 is an exploded isometric view of the cable management enclosure.

As shown in FIG. 17, the cable management enclosure 600 includes an elongate bottom panel 608 having a first end portion 610 and a second end portion 612. The front panel 604 is coupled to the first end portion 610 and an end panel 614 is coupled to the second end portion 612. The front panel 604 of the illustrated embodiment includes obround apertures 606 sized to receive corresponding grommets 602. The apertures 606 in the front panel 604 and the corresponding grommets 602 in other embodiments can have other shapes and sizes while still allowing movement of the cables into and out of the cable management enclosure 600.

A cover 616 is coupled to at least one of the bottom panel 608, the front panel 604, and the end panel 614. In some embodiments, the cover 616 is coupled to all of the panels including the bottom panel 608, the front panel 604, and the end panel 614. In some embodiments, the cover 616 includes a top panel 618 and a pair of side panels 620. Two enclosure partitions 622 are positioned in the enclosure to define at least three cable containment regions 623, each corresponding to one of the three grommets 602. Although three vertically oriented cable containment regions 623 are described herein, other arrangements are possible. For example, in other embodiments the enclosure can have a greater or fewer number of cable containment regions. In other embodiments, some or all of the cable containment regions can be oriented horizontally.

In some embodiments, the cable management enclosure 600 can include a latch, such as a top latch 624. The top latch 624 can be mounted to the top panel 618 with a barb 626 extending through an aperture 628 to engage a corresponding barb aperture 132 (FIG. 10). In some embodiments, the top latch 624 can comprise a leaf spring attached to the top panel 618 at one end, whereby the barb 626 is urged toward a latched position. In some embodiments, the front panel 604 includes a release aperture 632 through which a tool can be inserted to push on a ramped surface 630, thereby moving the barb 626 from the latched position.

Figure 7:
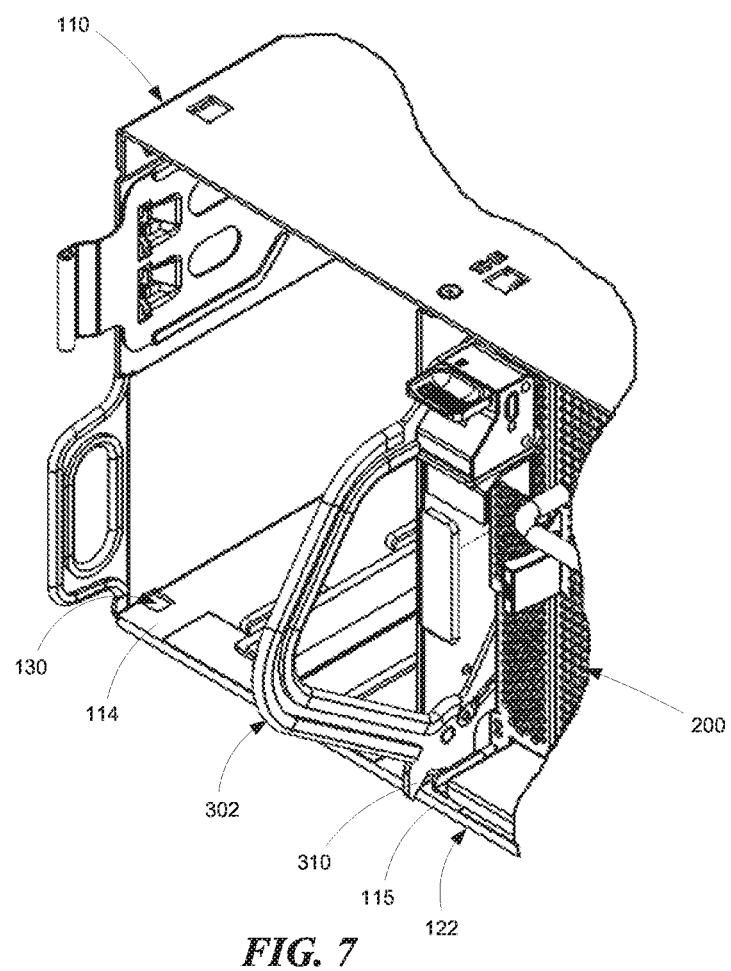
FIG. 7 is a partial isometric view illustrating the latch handle in a latched position and engaging the cubby chassis.
Figure 18:
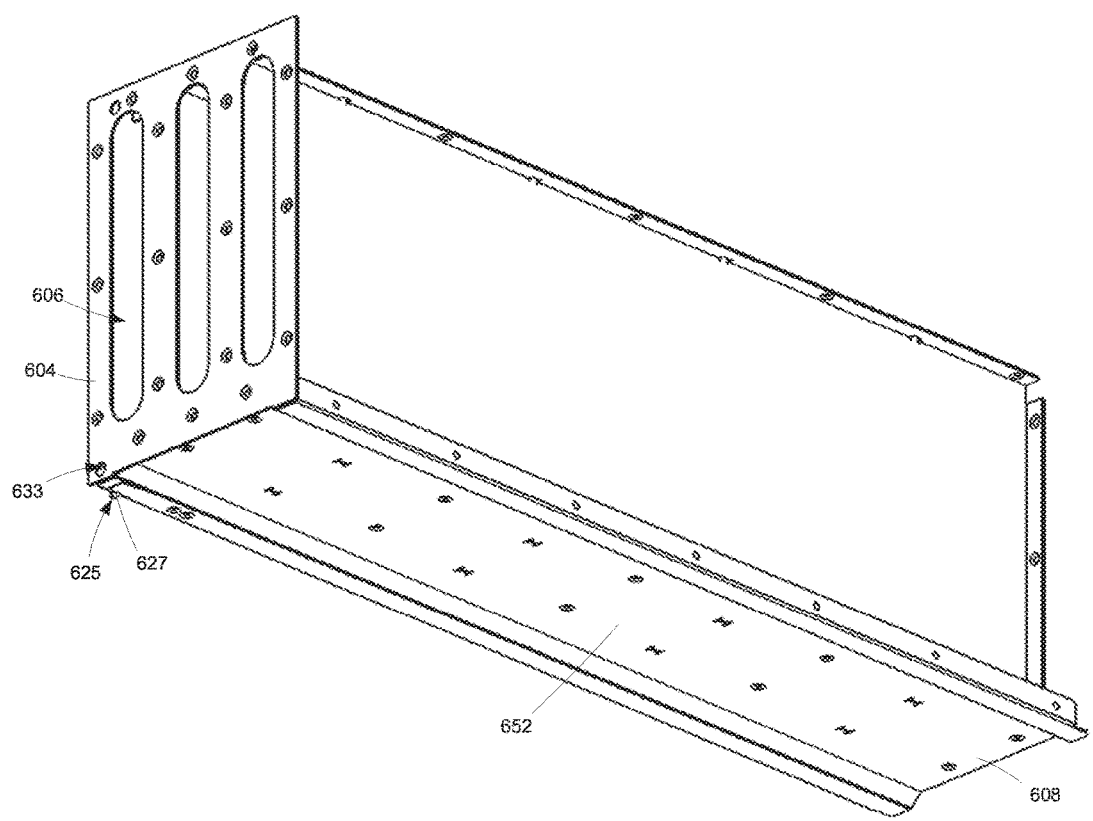
FIG. 18 is an isometric view of the cable management enclosure with the top portion removed.

As shown in FIG. 18, the cable management enclosure 600 can also include a bottom latch 625 mounted to the bottom panel 608. The bottom latch 625 can be constructed in a similar manner as that described above with respect to the top latch 624. For example, the bottom latch 625 can include a barb 627 positioned to releasably engage a corresponding latch aperture 130 (FIG. 7). In some embodiments, the front panel 604 includes a release aperture 633 through which a tool can be inserted to unlatch the barb 627. The bottom panel 608 can include a recessed region 652 to provide clearance for a conductor PCB 126, whereby the cable management enclosure 600 can be inserted into any of the sled positions 122 (FIG. 3).

Figure 19A:
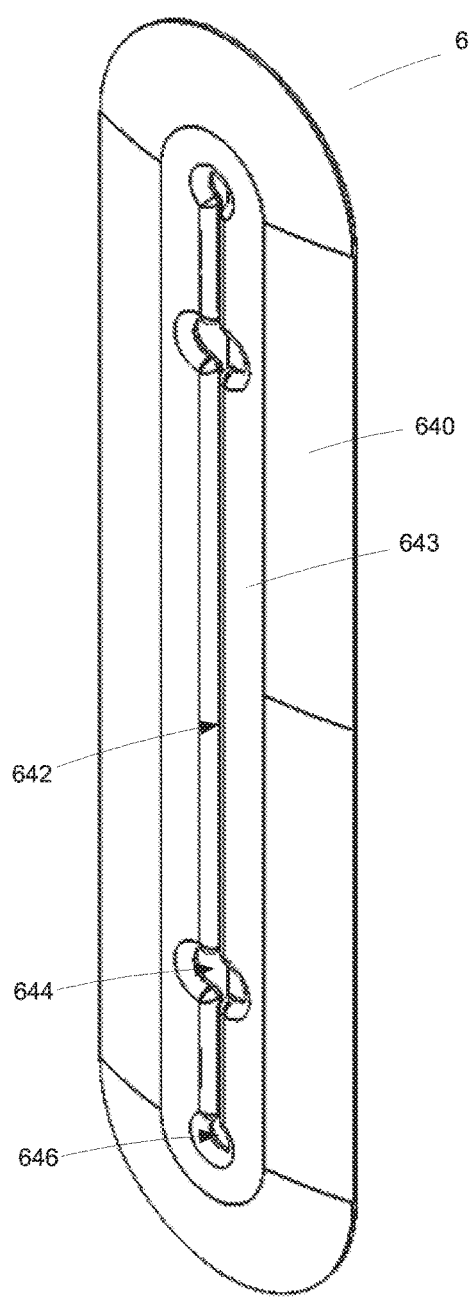
FIG. 19A is a front isometric view of a cable management grommet according to a representative embodiment.
Figure 19B:
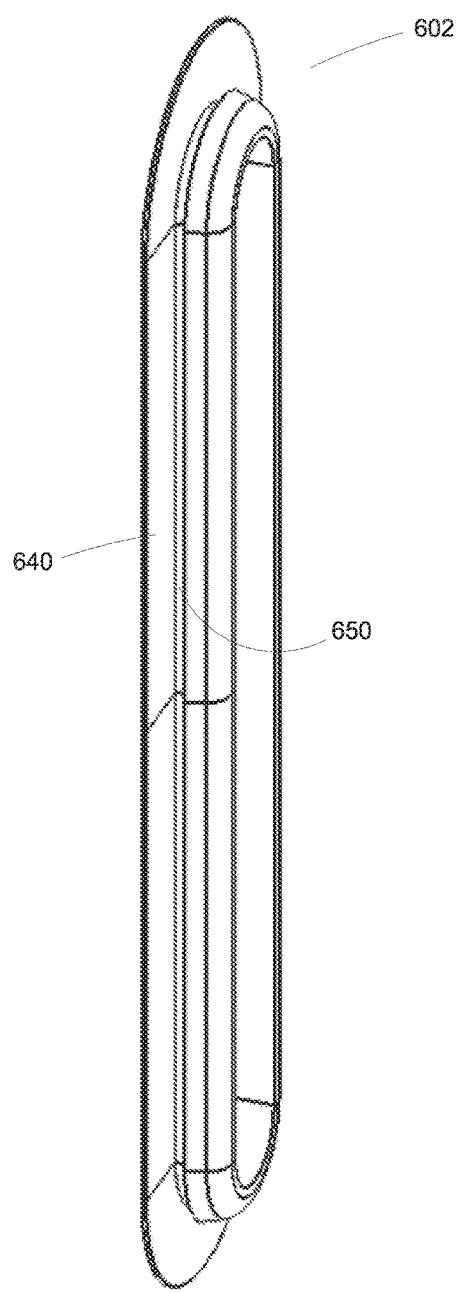
FIG. 19B is a rear isometric view of the cable management grommet.

As shown in FIGS. 19A and 19B, the grommets 602 can include an exterior flange 640 confronting an exterior surface of the front panel 604 (FIG. 18). The grommets 602 also include an elongate slit 642 having a surrounding flexible interior flange 643. The interior flange 643 is flexible to allow a loop of cable to be pushed through the slit 642. In some embodiments, the interior flange 643 includes openings sized and configured to receive different cable types. For example, in the depicted embodiment, the interior flange 643 includes oval openings 644 to receive flat cables and smaller round openings 646 to receive round cables. As best shown in FIG. 19B, the grommets 602 each include a surrounding groove 650 positioned to engage a surrounding edge margin of the obround apertures 606 (FIG. 18).

Figure 20:
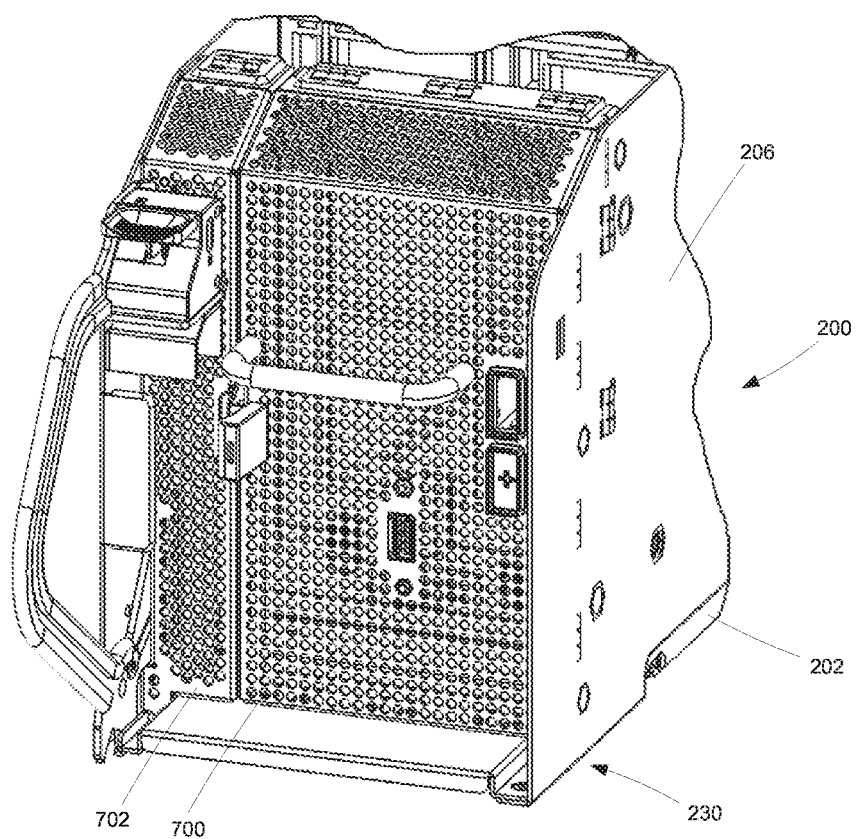
FIG. 20 is a partial isometric view of a device sled illustrating an interference shield according to a representative embodiment.

As shown in FIG. 20, each device sled 200 can include an interference shield 700 removably coupled to a shield support bracket 702 and the second sidewall 206 of the sled chassis 202. The removable interference shield 700 provides EMI and RFI protection for the device sled 200 and also provides access to components within the front end portion 230 of the device sled 200 by being easily removable. In some embodiments, the interference shield 700 and the shield support bracket 702 can comprise an electrically conductive material, such as metal, for example.

Figure 21:
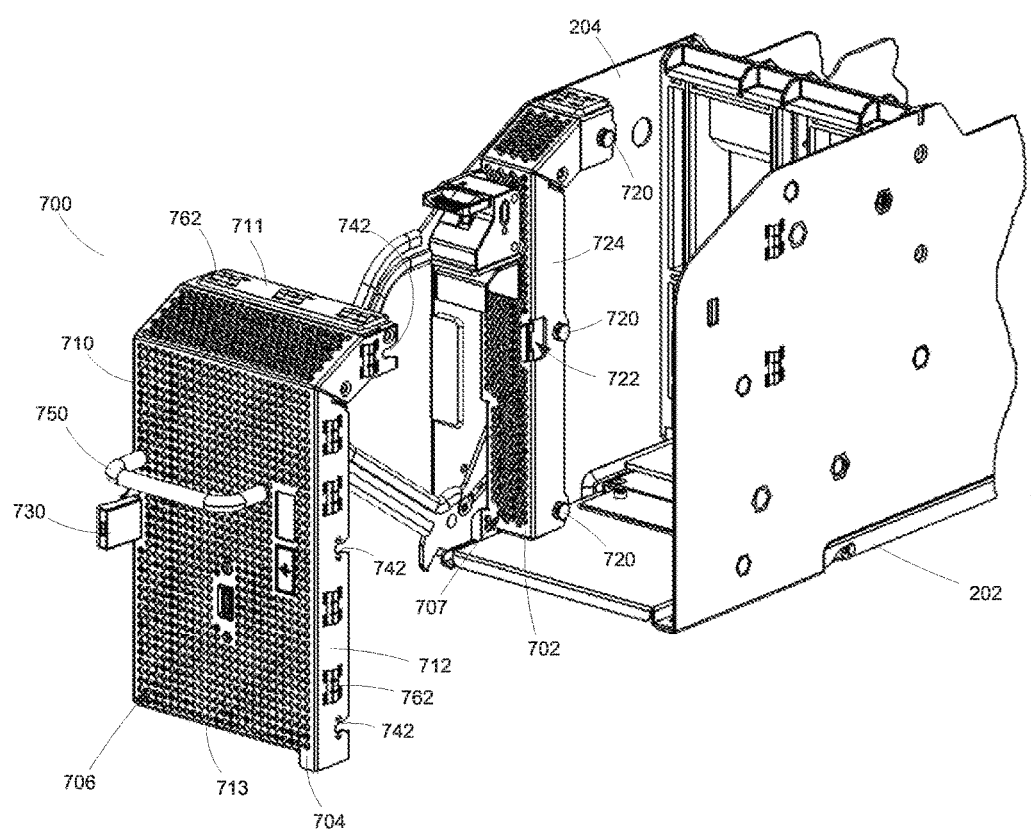
FIG. 21 is a partial isometric view of the interference shield removed from the device sled.
Figure 22:
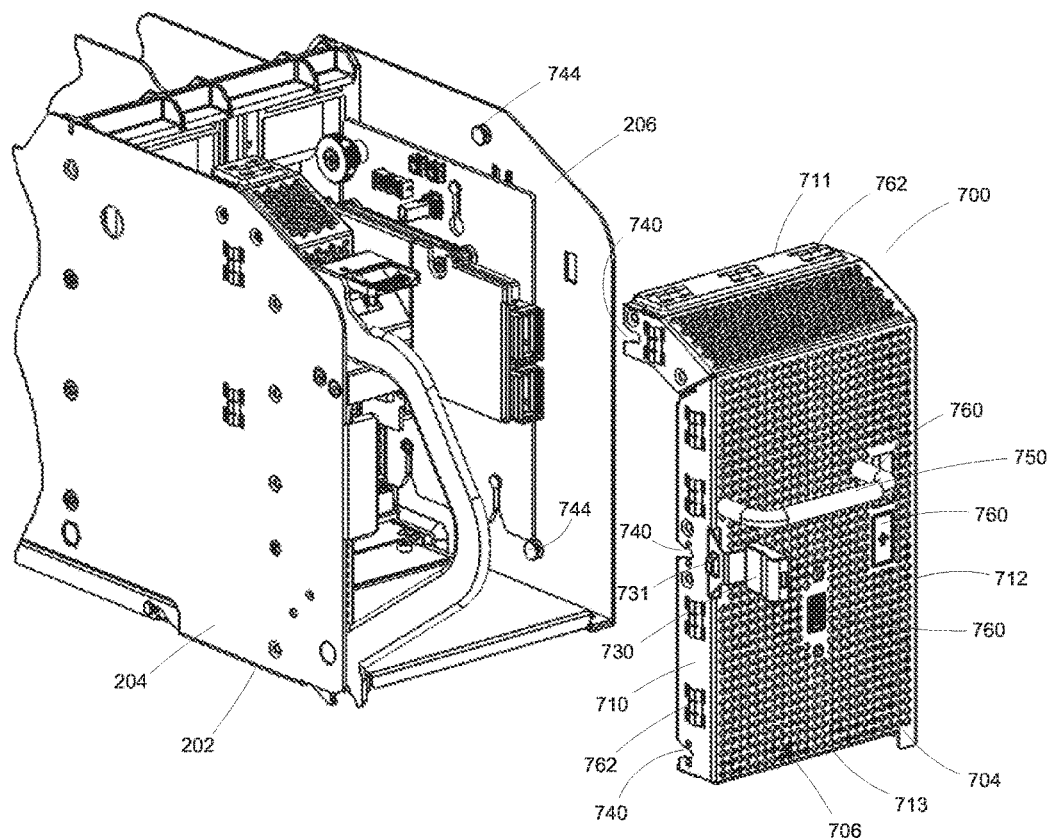
FIG. 22 is a partial isometric view similar to FIG. 21 as viewed from the opposite side.

With further reference to FIGS. 21 and 22, in a representative embodiment, the shield support bracket 702 is coupled to the first sidewall 204 and includes three bracket mounting features, such as pins 720. The bracket mounting pins 720 can be pressed into, or otherwise secured to, the bracket side flange 724, as shown. The bracket side flange 724 can also include a shield latch aperture 722 positioned to engage a shield latch 730 disposed on a shield panel 704. The interference shield panel 704 and the shield support bracket 702 can include a plurality of air flow apertures 706 and 707, respectively. First and second opposed side flanges, 710 and 712, respectively, extend from the shield panel 704. The first side flange 710 can include one or more first slots 740 (FIG. 22) positioned to receive a corresponding one of the bracket mounting pins 720 (FIG. 21). The second side flange 712 can include one or more second slots 742 (FIG. 21) each positioned to receive a corresponding sidewall mounting pin 744 (FIG. 22). The first and second slots 740 and 742 can be configured to clip onto their corresponding mounting pins 720 and 744 in order to help retain the shield 700 in the sled chassis 202.

As best shown in FIG. 22, the shield latch 730 can be coupled to the first side flange 710 and can include a latch barb 731 positioned to releasably engage the shield support bracket shield latch aperture 722 (FIG. 21). In some embodiments, a handle 750 can be coupled to the shield panel 704 and positioned adjacent the latch 730 such that the latch 730 can be disengaged from the shield support bracket 702 by a user's thumb or other portion of the user's hand when the handle 750 is grasped. The handle 750 allows a user to then pull the shield 700 from the chassis 202. In some embodiments, the shield panel 704 includes one or more connector apertures 760 formed therethrough and positioned to receive corresponding connectors when the interference shield 700 is coupled to the shield support bracket 702 and the second sidewall 206.

In some embodiments, the interference shield 700 includes opposed upper and lower flanges 711 and 713, respectively. In some embodiments, one or more spring contacts 762 can be disposed on each of the first and second side flanges (710, 712) and the upper and lower flanges (711, 713). The spring contacts 762 help ensure that continuity is established between the sled chassis 202, the cubby chassis top panel 112 (FIG. 1), and the interference shield 700.

Remarks

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments. Accordingly, the embodiments are not limited except as by the appended claims.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

What is claimed is:

1. A device sled, comprising:
   a sled chassis having a bottom wall and first and second opposed sidewalls;
   a pair of spaced apart channels, each coupled to the bottom wall and including a latch aperture; and
   a fan cartridge having a first end portion and a second end portion removably inserted between the pair of spaced apart channels, the fan cartridge comprising:
      a cartridge frame;
      one or more fans coupled to the cartridge frame; and
      one or more latches positioned on the cartridge frame to releasably engage the latch aperture when the fan cartridge is inserted between the pair of spaced apart channels,
      wherein each channel of the pair of spaced apart channels comprises a central panel having opposed longitudinal sides and a pair of rails, each rail extending at least partially along a corresponding one of the longitudinal sides of the central panel,
      wherein each of the central panels includes a recessed region forming a cavity designed to receive a latch pocket, each latch pocket being configured to receive a latch of the one or more latches, each latch pocket comprising the latch aperture,
      wherein each of the one or more latches is positioned in a corresponding latch pocket located proximate the second end portion of the cartridge frame, and
      wherein each latch includes a barb connected to a latch tab that extends through each associated latch aperture in each latch pocket.

2. The device sled of claim 1, wherein the pair of spaced apart channels are each coupled to a corresponding one of the first and second opposed sidewalls.

3. The device sled of claim 1, wherein the one or more fans comprises two fans.

4. The device sled of claim 1, wherein the fan cartridge further comprises a cartridge connector mated with a corresponding chassis connector when the fan cartridge is inserted between the pair of spaced apart channels.

5. The device sled of claim 4, wherein the cartridge frame includes opposed first and second end portions, and wherein the cartridge connector is positioned proximate the first end portion and the one or more latches are positioned proximate the second end portion.

6. The device sled of claim 4, wherein at least one of the central panels includes a recessed region positioned to receive the latch pocket.

7. A device sled fan assembly, comprising:
a pair of channels, each mountable to a device sled chassis in spaced apart relation to each other, and each including a latch aperture; and
a fan cartridge having a first end portion and a second end portion removably insertable between the pair of channels, the fan cartridge comprising:
cartridge frame;
one or more fans coupled to the cartridge frame; and
one or more latches positioned on the cartridge frame to engage the latch aperture when the fan cartridge is inserted between the pair of spaced apart channels,
wherein each channel of the pair of channels comprises a central panel having opposed longitudinal sides and a pair of rails, each rail extending at least partially along a corresponding one of the longitudinal sides of the central panel,
wherein each of the central panels includes a recessed region forming a cavity designed to receive a latch pocket, each latch pocket being configured to receive a latch of the one or more latches, each latch pocket comprising the latch aperture,
wherein each of the one or more latches is positioned in a corresponding latch pocket located proximate the second end portion of the cartridge frame, and
wherein each latch includes a barb connected to a latch tab that extends through each associated latch aperture in each latch pocket.

8. The fan assembly of claim 7, wherein the pair of channels are each couplable to at least a bottom wall of the sled chassis.

9. The fan assembly of claim 7, wherein the fan cartridge further comprises a cartridge connector mated with a corresponding chassis connector when the fan cartridge is inserted between the pair of spaced apart channels.

10. The fan assembly of claim 9, wherein the cartridge frame includes opposed first and second end portions, and wherein the cartridge connector is positioned proximate the first end portion and the one or more latches are positioned proximate the second end portion.

11. The fan assembly of claim 10, wherein at least one of the central panels includes a recessed region positioned to receive the latch pocket.

12. A device sled fan assembly, comprising:
a pair of channels, each couplable to a bottom wall of a device sled chassis in spaced apart relation to each other, and each including a latch aperture; and
a fan cartridge having a first end portion and a second end portion removably insertable between the pair of channels, the fan cartridge comprising:
a cartridge frame;
two fans coupled to the cartridge frame;
a cartridge connector mateable with a corresponding chassis connector when the fan cartridge is inserted between the pair of channels; and
two latches, each positioned on the cartridge frame to engage the latch aperture when the fan cartridge is inserted between the pair of spaced apart channels,
wherein each channel of the pair of channels comprises a central panel having opposed longitudinal sides and a pair of rails, each rail extending at least partially along a corresponding one of the longitudinal sides of the central panel,
wherein each of the central panels includes a recessed region forming a cavity designed to receive a latch pocket, each latch pocket being configured to receive a latch of the one or more latches, each latch pocket comprising the latch aperture,
wherein each of the one or more latches is positioned in a corresponding latch pocket located proximate the second end portion of the cartridge frame, and
wherein each latch includes a barb connected to a latch tab that extends through each associated latch aperture in each latch pocket.

13. The fan assembly of claim 12, wherein the cartridge frame includes opposed first and second end portions, and wherein the cartridge connector is positioned proximate the first end portion and the latches are positioned proximate the second end portion.

14. The fan assembly of claim 13, wherein each central panel includes a recessed region positioned to receive a corresponding one of the latch pockets.

* * * * *